United States Patent
Conley, Jr. et al.

(10) Patent No.: US 7,029,944 B1
(45) Date of Patent: Apr. 18, 2006

(54) METHODS OF FORMING A MICROLENS ARRAY OVER A SUBSTRATE EMPLOYING A CMP STOP

(75) Inventors: John F. Conley, Jr., Camas, WA (US); Yoshi Ono, Camas, WA (US); Wei Gao, Vancouver, WA (US); David R. Evans, Beaverton, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 16 days.

(21) Appl. No.: 10/956,789

(22) Filed: Sep. 30, 2004

(51) Int. Cl.
*H01L 21/00* (2006.01)

(52) U.S. Cl. .............. 438/69; 438/60; 438/73

(58) Field of Classification Search .......... 438/60, 438/69, 73
See application file for complete search history.

(56) References Cited

U.S. PATENT DOCUMENTS

| | | | |
|---|---|---|---|
| 5,324,623 A | | 6/1994 | Tsumori |
| 5,593,913 A | * | 1/1997 | Aoki ........................... 438/69 |
| 5,595,930 A | * | 1/1997 | Baek ........................... 438/60 |
| 6,104,021 A | * | 8/2000 | Ogawa .................... 250/208.1 |
| 6,163,407 A | | 12/2000 | Okazaki et al. |
| 6,171,885 B1 | * | 1/2001 | Fan et al. ...................... 438/70 |
| 6,291,811 B1 | * | 9/2001 | Ogawa .................... 250/208.1 |
| 6,379,993 B1 | * | 4/2002 | Nakano et al. ................ 438/75 |
| 6,423,569 B1 | * | 7/2002 | Zhang et al. .................. 438/98 |
| 6,437,918 B1 | | 8/2002 | Hamanaka et al. |
| 6,737,719 B1 | * | 5/2004 | Yamamoto ................... 257/432 |
| 6,803,250 B1 | * | 10/2004 | Yaung et al. .................. 438/70 |
| 6,803,261 B1 | * | 10/2004 | Zhang et al. ................ 438/144 |
| 6,872,584 B1 | * | 3/2005 | Nakashiba .................... 438/22 |
| 6,878,564 B1 | * | 4/2005 | Silverbrook ................. 438/27 |
| 6,940,654 B1 | * | 9/2005 | Tang ........................... 359/619 |
| 2004/0080005 A1 | * | 4/2004 | Yamamoto ................... 257/432 |
| 2004/0171184 A1 | * | 9/2004 | Maruyama et al. ........... 438/33 |
| 2004/0211884 A1 | * | 10/2004 | Fang et al. ............... 250/214.1 |

* cited by examiner

*Primary Examiner*—David Nelms
*Assistant Examiner*—David Goodwin
(74) *Attorney, Agent, or Firm*—David C. Ripma

(57) ABSTRACT

A method of forming a microlens structure is provided along with a CCD array structure employing a microlens array. An embodiment of the method comprises providing a substrate having a surface with photo-elements on the surface; depositing a transparent material overlying the surface of the substrate; depositing a CMP stop overlying the transparent material; depositing a lens-shaping layer overlying the CMP stop layer; depositing and patterning a photoresist layer overlying the lens-shaping layer to form openings to expose the lens-shaping layer; introducing a first isotropic etchant into the openings and etching the lens-shaping layer where exposed to form initial lens shapes having a radius; stripping the photoresist; exposing the lens-shaping layer to a second isotropic etchant to increase the radius of the lens shapes; transferring the lens shape through the CMP stop layer into the transparent material using an anisotropic etch; and depositing a lens material overlying the transparent material, whereby the lens shapes are at least partially filled with lens material. Planarizing the lens material using CMP and stopping at the CMP stop layer.

17 Claims, 6 Drawing Sheets

METHODS OF FORMING A MICROLENS ARRAY OVER A SUBSTRATE EMPLOYING A CMP STOP

BACKGROUND OF THE INVENTION

The present method relates to methods of forming microlens structures on a substrate.

Increasing the resolution of image sensors requires decreasing pixel size. Decreasing pixel size reduces the photoactive area of each pixel, which can reduce the amount of light sensed by each pixel.

DETAILED DESCRIPTION OF THE INVENTION

Accordingly, a method is provided to form a microlens to increase the light impinging on each pixel of an active photodetector device. If the microlens is fabricated properly to provide the proper shape and position, the microlens will direct light impinging on the lens onto the photodetector pixel. If the microlens has an area larger than the pixel area, it can collect light that would normally impinge on the areas outside each individual pixel and direct the light onto the photodetector pixel. Increasing the amount of light impinging on the photodetector pixel will correspondingly increase the electrical signal produced by the pixel.

Figure 1:
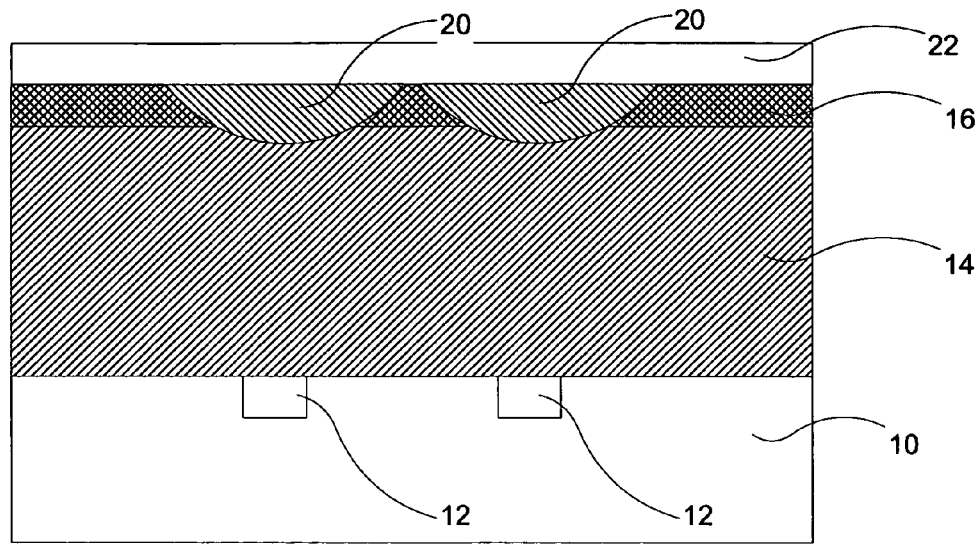
FIG. 1 is a cross sectional view of a microlens structure overlying a substrate.

FIG. 1 shows an embodiment of a microlens structure formed according to an embodiment of the present method. A substrate 10 has at least one photo-element 12 formed thereon. The photo-elements 12 may be photosensitive elements, for example CCD camera pixels; or photosensors, or photoemissive elements. A transparent layer 14 has been deposited overlying the substrate 10. Microlenses 20 are formed above a photo-element 12. As shown, the top planar surface of the microlenses 20 corresponds to the top of a CMP stop layer 16. An anti-reflection layer 22 is formed overlying the microlenses 20. The microlens 20 is an approximately plano-convex lens with the convex surface directed towards the photo-element 12. The thickness of the transparent layer 14 will be determined, in part, based on the desired lens curvature and focal length considerations. While having light impinge on the planar surface first, instead of the convex surface, increases known aberrations, this is less critical in the present application, which is concerned with increasing the amount of light impinging on each photo-element 12, rather than trying to clearly focus an image.

Figure 2:
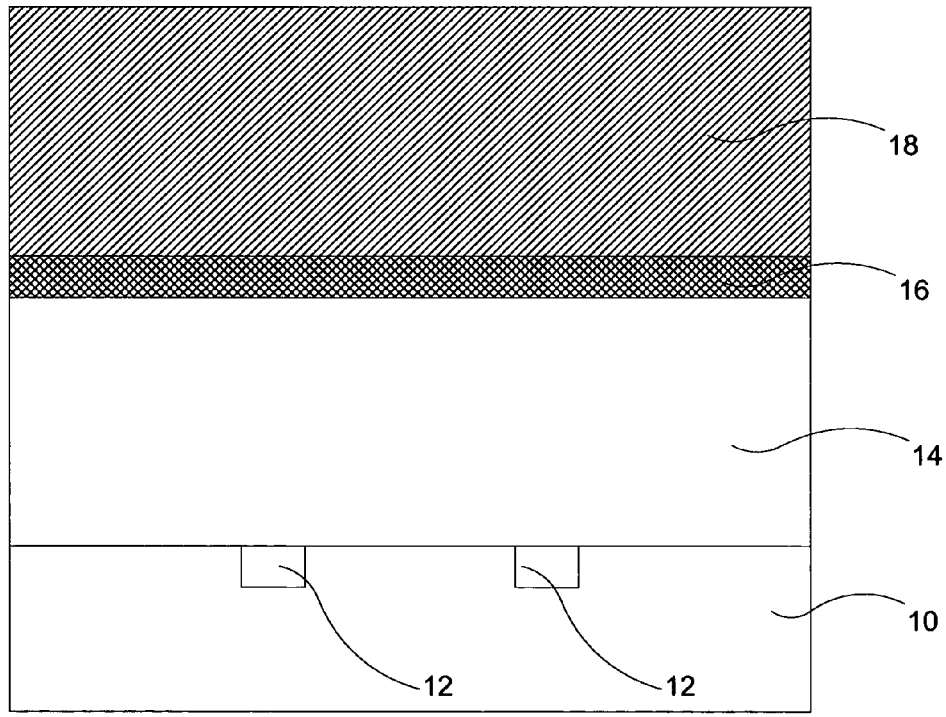
FIG. 2 is a cross-sectional view of an intermediate microlens structure overlying a substrate.

In one embodiment of the present process, microlenses 20 are formed overlying the photo-elements 12, eliminating the need to form the lenses and then transfer them to the substrate. Accordingly, a substrate having the desired photoelements 12 formed on the substrate is prepared. FIG. 2 shows a substrate 10 having pixels 12 for sensing light. The transparent layer 14 has been deposited overlying the pixels. The CMP stop layer 16 has been deposited overlying the transparent layer 14, followed by a lens-shaping layer 18. The term "lens-shaping material", or "lens-shaping layer" refers to a material layer that is suitable for isotropic etch processes to form the basic shape of a lens pattern, for example a lens-shaped cavity.

Figure 3:
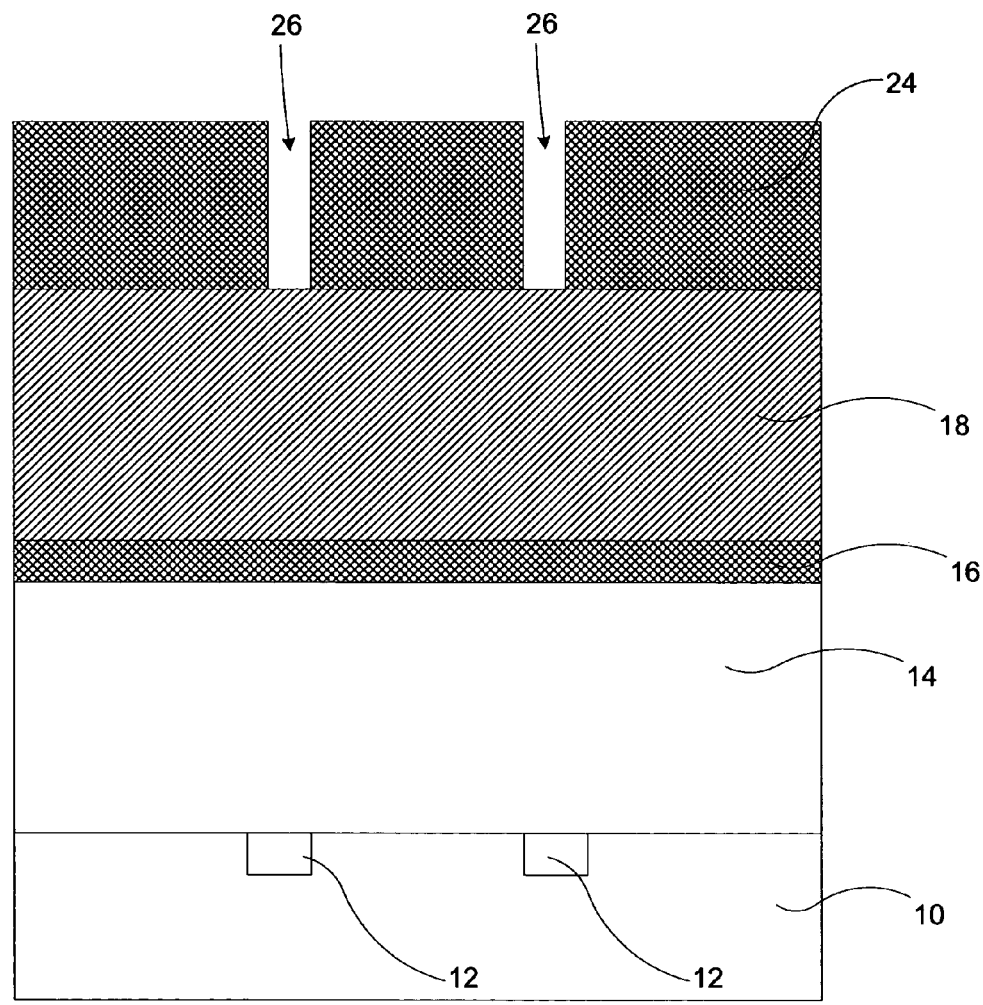
FIG. 3 is a cross-sectional view of an intermediate microlens structure overlying a substrate.

FIG. 3 shows a layer of photoresist 24 deposited overlying the lens-shaping layer 18. As shown, openings 26 have been patterned into the photoresist. The openings 26 will be used to introduce an etchant, and should be made as small as possible while still allowing introduction of the etchant.

Figure 4:
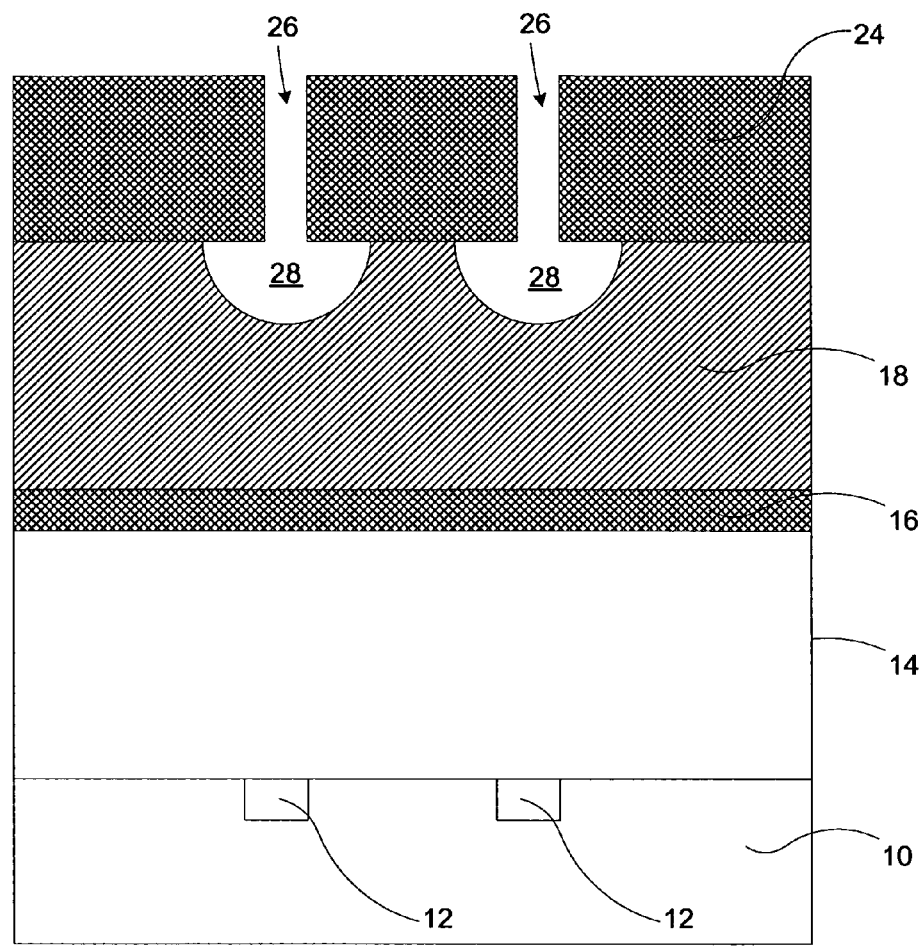
FIG. 4 is a cross-sectional view of an intermediate microlens structure overlying a substrate.

Next an isotropic wet etch is performed by introducing an etchant through the openings 26 to etch the lens-shaping layer 18. If the openings 26 are sufficiently small, they will act like a point source of etchant, producing a generally hemispherical etch pattern in the lens-shaping layer 18. Since the lens-shaping layer 18 does not need to be transparent, a variety of etchable materials may be used, for example polysilicon, amorphous silicon, silicon dioxide, or polyimide. A suitable etchant for isotropically etching the lens-shaping layer will need to be used, as understood by one of ordinary skill in the art. For example, if the lens-shaping layer 18 is silicon dioxide, buffered HF may be used as the etchant. A mixture of nitric acid and hydrofluoric acid may be used if the lens-shaping layer 18 is amorphous silicon, or polysilicon. This etch step produces the initial lens shapes 28 as shown in FIG. 4. The etch time may need to be limited to avoid lift-off of the photoresist 24.

Figure 5:
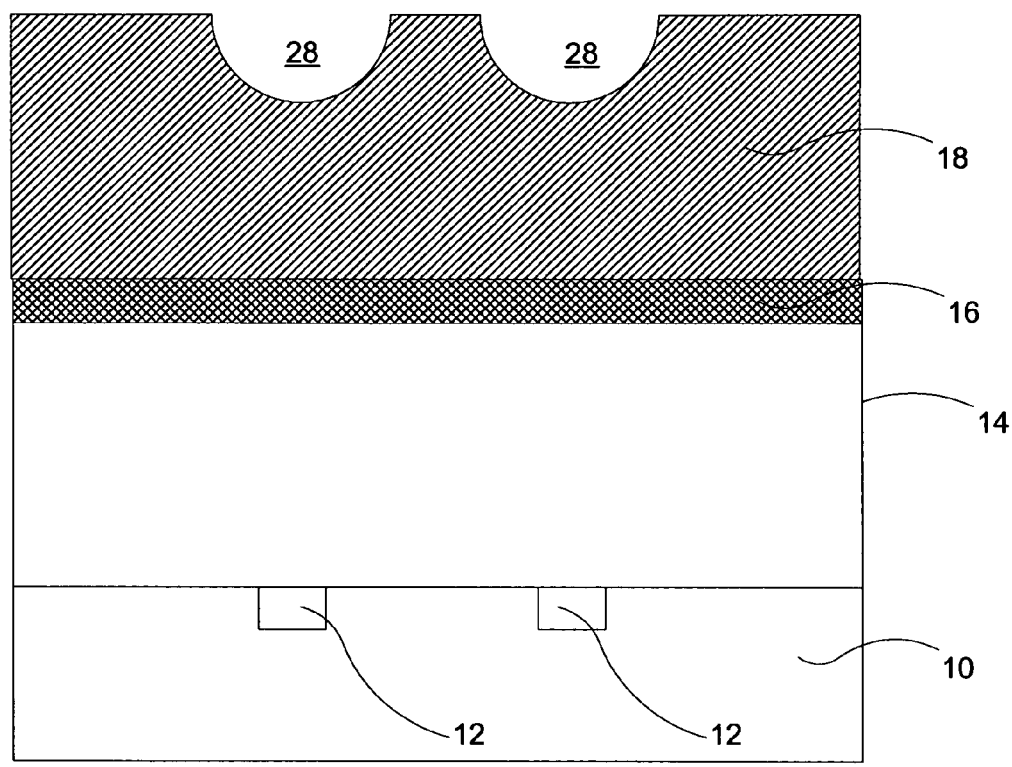
FIG. 5 is a cross-sectional view of an intermediate microlens structure overlying a substrate.

Once the initial lens shapes 28 have been formed, the photoresist is then stripped, leaving the initial lens shapes 28 exposed as shown in FIG. 5.

Figure 6:
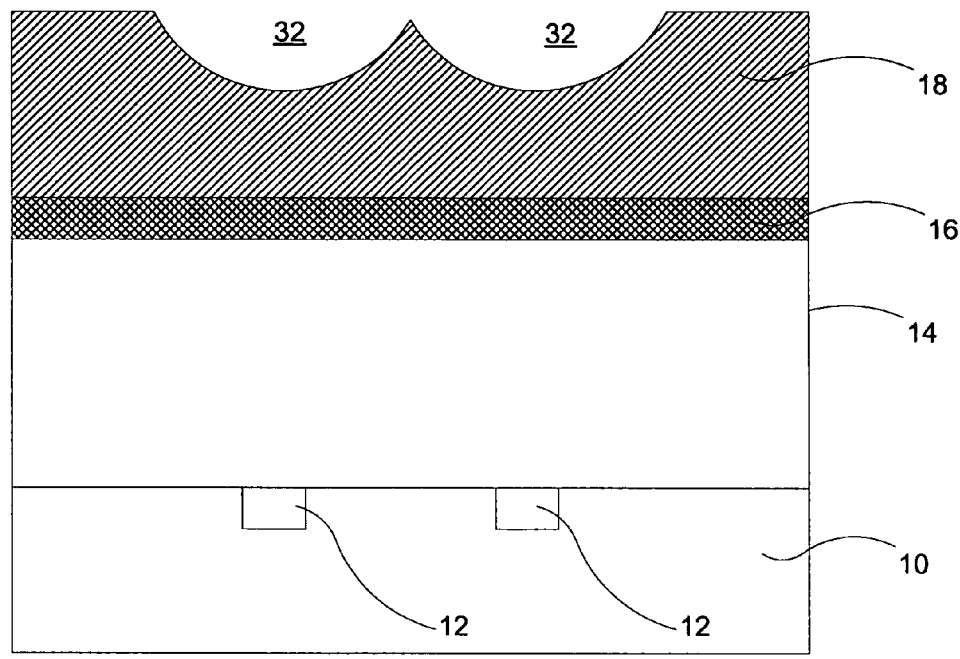
FIG. 6 is a cross-sectional view of an intermediate microlens structure overlying a substrate.

A second isotropic wet etch, possibly using the same etchant as that used for the first isotropic wet etch, increases the radius of the initial lens shapes to produce a final lens curvature, as shown in FIG. 6. The overall thickness of the lens-shaping layer 18 will also be reduced during this second isotropic wet etch process, so the original thickness of lens-shaping layer 18 should be thick enough to account for the reduction caused by the second isotropic wet etch. As the radius of curvature of adjacent lens shapes 32 increases, they may overlap. This is not an undesirable effect as it increases the density of the lens array, while desirably collecting as much light as possible. If the entire surface is covered with an array of lenses with no space in between, hopefully all light impinging on the surface of the lens array will be focused onto the underlying array of photo-elements 12 of the final device.

Figure 7:
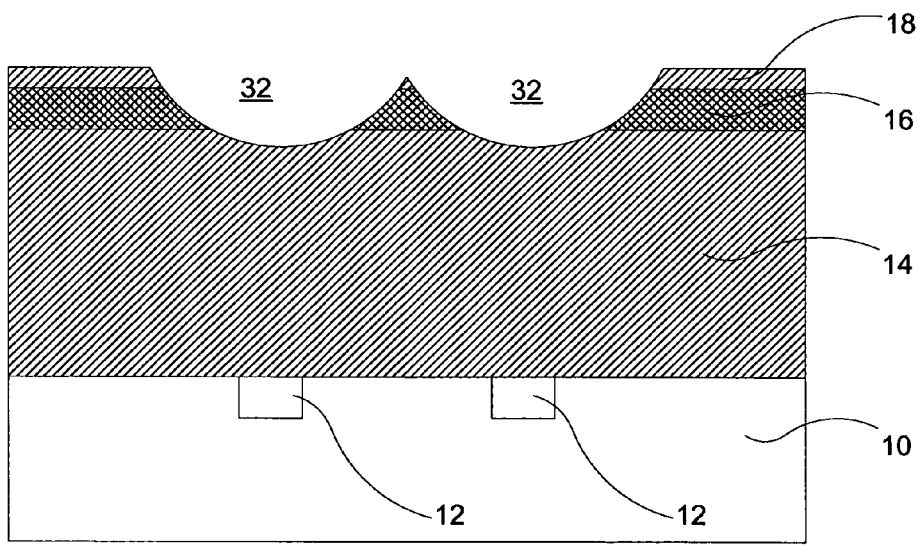
FIG. 7 is a cross-sectional view of an intermediate microlens structure overlying a substrate.

Following formation of lens shapes 32, an anisotropic etch, for example a dry etch process is used to transfer the lens shapes through the CMP stop layer 16 and into the transparent layer 14, as shown in FIG. 7. Although the lens shape may be distorted during the transfer process, it should still be suitable for concentrating light onto the photo-elements 12. This transfer process allows the lens shape to essentially be moved closer to the photo-elements 12. The final distance between the bottom of the lens shape 32 and the photo-elements 12 will be determined in part by the focal length of the final lenses. If the transparent layer 14 is silicon dioxide, a fluorine-based anisotropic etchant may be used, for example a fluorocarbon such as $C_3F_8$ with argon. The ratio of C and F can be modified to change the etch profile. One of ordinary skill in the art will be familiar with a variety of anisotropic etch processes depending on the material selected for the lens-shaping material 18, the CMP stop layer 16 and the transparent material 14. For example, a $Cl_2/BCl_3$ etch may be used. In some embodiments a mixture of etchants may be used to control the etch rate through the different materials. In another embodiment an ion milling process may used to achieve the anisotropic etch, without the need for special considerations related to etch chemistry.

Figure 8:
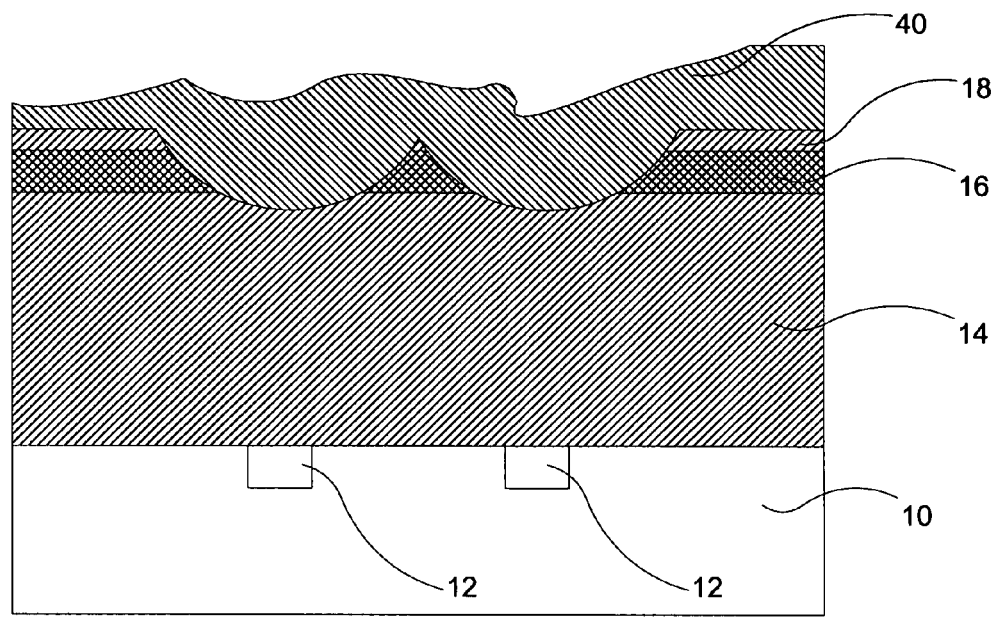
FIG. 8 is a cross-sectional view of an intermediate microlens structure overlying a substrate.

As shown in FIG. 8, once the lens shape 32 is formed, and transferred to the transparent layer 14, a lens material 40 is deposited to fill the lens shapes 32. The lens material may be deposited by a sputtering process, a CVD process, a spin-on process, or other suitable process.

Figure 9:
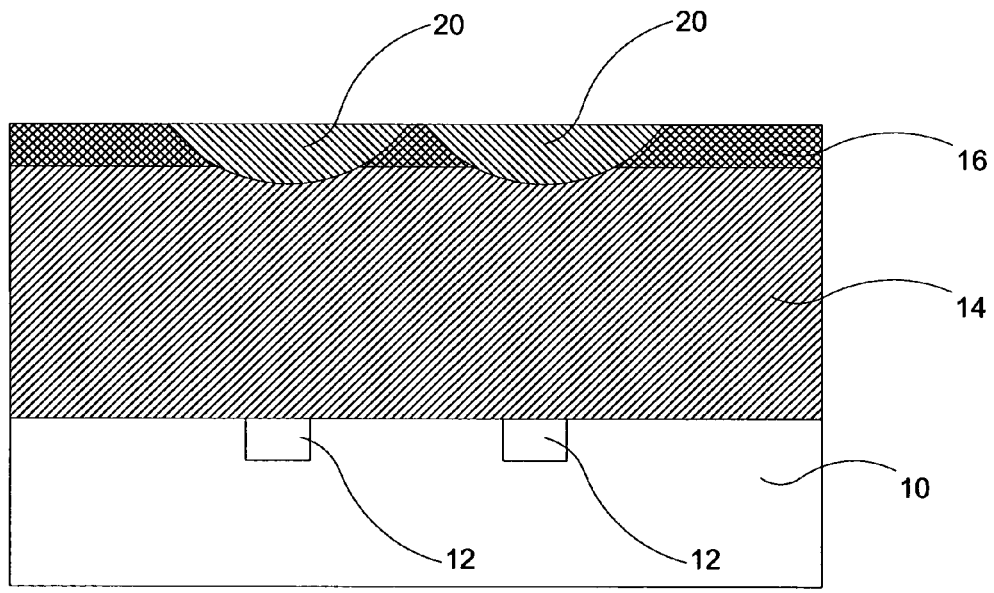
FIG. 9 is a cross-sectional view of an intermediate microlens structure overlying a substrate.

After the lens material is deposited, a planarizing step is performed. In an embodiment of the present method, a CMP process is used to planarize the lens material 40. The CMP process continues until reaching the CMP stop 16, as shown in FIG. 9. The CMP stop layer 16 comprises a material with a lower polishing rate than lens-shaping material 18 or lens material 40. The CMP stop layer may be composed of a metal such as Ir or Pt, a refractory metal such as Ti, TiN, Ni, Pd, Ta or other suitable refractory metal. In some embodiments a dielectric material such as silicon nitride, aluminum oxide or aluminum nitride may also be used. Some of the available CMP stop layer 16 materials may also be used as lens-shaping materials 18, but typically not in the same embodiment. The use of a CMP stop layer 16 may allow for greater control of the thickness of the final microlenses 20 and the lens to photo- element 12 distance. In some embodiments, the amount of planarizing is not critical as long as enough lens remains to achieve improved light collection. In some embodiments, if metal is used for the CMP stop layer 18, the CMP stop layer may also block light between lenses reducing stray light.

Referring again to FIG. 1, after planarizing is achieved, the AR layer 22 may be applied, producing the final structure. The substrate may be composed of any suitable material for forming or supporting a photo-element 12. For example in some embodiments, the substrate 10 is a silicon substrate, an SOI substrate, quartz substrate, or glass substrate.

In an embodiment of the present microlens structure, wherein it is desirable to concentrate light onto the photo-element 12, the transparent layer 14 will have a lower refractive index than microlenses 20. For example, if the transparent layer 14 has a refractive index of approximately 1.5, the microlenses 20 should have a refractive index equal to or greater than approximately 2. If the transparent layer 14 is silicon dioxide or glass, the microlenses 20 are composed of $HfO_2$, $TiO_2$, $ZrO_2$, $ZnO_2$, or other lens material with a refractive index of approximately 2 or higher.

In an embodiment of the present microlens structure comprising a single material AR layer 22, the AR layer is preferably composed of a material with a refractive index between that of air and the lens material. For example, silicon dioxide may be used over microlenses having a refractive index of approximately 2.

The thickness of the transparent layer 14 will be determined, in part, based on the desired lens curvature and focal length considerations, as well as the amount of etching caused by the second isotropic wet etch. The thickness of the lens-shaping layer used to initially form the lens shape will also be thick enough to accommodate the final curvature of the lens shape, but need not take into consideration the focal distance. In one embodiment of the present microlens structure, the desired focal length of the microlenses 20 is between approximately 2 µm and 8 µm. The thickness of the transparent layer 14 as deposited should be thick enough to achieve the desired focal length distance following all etching and planarization steps.

Note that since the microlens structures are formed directly overlying the photo-elements 12, there is no need to provide a separating layer, or to transfer the lens structure from a separate mold and reposition it.

Although embodiments have been discussed above, the coverage is not limited to any specific embodiment. Rather, the claims shall determine the scope of the invention.

What is claimed is:

1. A method of forming a microlens structure comprising:
   a) providing a substrate having a surface with photo-elements on the surface;
   b) depositing a transparent material overlying the surface of the substrate;
   c) depositing a CMP stop layer overlying the transparent material;
   d) depositing a lens-shaping material overlying the CMP stop layer;
   e) depositing and patterning a photoresist layer overlying the lens-shaping material to form openings to expose the transparent material;
   f) introducing a first isotropic etchant into the openings and etching the lens-shaping material where exposed to form initial lens shapes having a radius;
   g) stripping the photoresist;
   h) exposing the lens-shaping material to a second isotropic etchant to increase the radius of the lens shapes;
   i) transferring the lens shapes through the CMP layer to the underlying transparent material; and
   j) depositing a lens material overlying the transparent material, whereby the lens shapes are at least partially filled with lens material.

2. The method of claim 1, wherein the transparent material is silicon dioxide, or glass.

3. The method of claim 1, wherein the CMP stop layer is a metal.

4. The method of claim 3, wherein the metal is Ir or Pt.

5. The method of claim 1, wherein the CMP stop layer is a refractory metal.

6. The method of claim 5, wherein the refractory metal is Ti, TiN, Ni, Pd or Ta.

7. The method of claim 1, wherein the CMP stop layer is a dielectric material.

8. The method of claim 7, wherein the dielectric material is silicon nitride, aluminum oxide, or aluminum nitride.

9. The method of claim 1, wherein the lens-shaping material is polysilicon, amorphous silicon, silicon dioxide or polyimide.

10. The method of claim 1, wherein the lens material has a higher refractive index than the transparent material.

11. The method of claim 2, wherein the lens material comprises $HfO_2$, $TiO_2$, $ZrO_2$, or $ZnO_2$.

12. The method of claim 1, further comprising forming an AR coating overlying the lens material.

13. The method of claim 4, further comprising forming a single layer AR coating overlying the lens material.

14. The method of claim 6, wherein the single layer AR coating comprises silicon dioxide, or glass.

15. The method of claim 1, further comprising planarizing the lens material.

16. The method of claim 8, wherein planarizing the lens material comprises chemical mechanical polishing (CMP) process.

17. A method of forming a microlens array over a CCD array comprising:
   a) providing a substrate comprising the CCD array;
   b) depositing a transparent layer comprising silicon dioxide, or glass overlying the CCD array;

c) depositing a CMP stop layer overlying the transparent material;
d) depositing a lens-shaping material overlying the CMP stop layer;
e) depositing and patterning a photoresist layer overlying the lens-shaping material to form openings to expose the transparent material;
f) performing a first isotropic etch process by introducing an etchant into the openings and etching the lens-shaping material where exposed to form initial lens shapes having a radius;
g) stripping the photoresist;
h) exposing the lens-shaping material to a second isotropic etch process to increase the radius of the lens shapes;
i) depositing a lens material comprising $HfO_2$, $TiO_2$, $ZrO_2$, or $ZnO_2$ overlying the transparent material whereby lenses are formed by the lens material at least partially filling the lens shapes;
j) planarizing the lens material using CMP stopping at the CMP stop layer; and
k) forming an AR coating overlying the lens material.

* * * * *